(12) United States Patent  (10) Patent No.: US 7,945,838 B2
Zhu et al.  (45) Date of Patent: May 17, 2011

(54) PARITY CHECK DECODER ARCHITECTURE

(75) Inventors: Yuming Zhu, Richardson, TX (US); Yanni Chen, Sunnyvale, CA (US); Dale E. Hocevar, Plano, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1047 days.

(21) Appl. No.: 11/744,357

(22) Filed: May 4, 2007

(65) Prior Publication Data

US 2007/0283215 A1 Dec. 6, 2007

Related U.S. Application Data

(60) Provisional application No. 60/746,552, filed on May 5, 2006.

(51) Int. Cl.
  *H03M 13/00* (2006.01)

(52) U.S. Cl. .......................... 714/755; 714/752; 714/758
(58) Field of Classification Search .................. 714/752, 714/755, 758
  See application file for complete search history.

(56) References Cited

U.S. PATENT DOCUMENTS

| 7,139,959 B2 | 11/2006 | Hocevar |
| 7,178,080 B2 | 2/2007 | Hocevar |
| 7,181,676 B2 | 2/2007 | Hocevar |
| 2002/0049947 A1* | 4/2002 | Sridharan et al. ............. 714/752 |

* cited by examiner

*Primary Examiner* — Sam Rizk
(74) *Attorney, Agent, or Firm* — Steven A. Shaw; W. James Brady; Frederick J. Telecky, Jr.

(57) ABSTRACT

A method and systems for reducing the complexity of a parity checker are described herein. In at least some preferred embodiments, a parity-check decoder includes column store units and one or more alignment units, which are coupled to the column store units. The column store units outnumber the alignments units.

21 Claims, 1 Drawing Sheet

PARITY CHECK DECODER ARCHITECTURE

CROSS-REFERENCE TO RELATED APPLICATIONS

This application claims priority to U.S. Provisional Patent Application No. 60/746,552, Entitled "Interconnect-Efficient, Complexity-Reduced Layered Architecture Of Low Density Parity Check (LDPC) Decoder," filed on May 5, 2006, incorporated herein by reference.

BACKGROUND

A problem common to digital data communication technology is the likelihood of data corruption. Data is usually corrupted by noise occurring in the communication channel. The noise interferes with the signal carrying the data over the channel, causing errors in the data bits, or symbols. Various techniques for detecting and correcting errors in the bits have been developed. At least some error detection and correction techniques are implemented through redundant coding of the bits. For example, parity bits may be inserted into the transmitted data stream sent over the communication channel. These parity bits do not add any additional information, but can be cross-referenced to detect and correct errors in the values of other bits. Of course, these parity bits are also prone to errors. As another example, a code may repeat the transmission; for instance, the payload is sent three times. The receiver deduces the payload by using a decoder to determine which bit in each position was received two or more times. The drawback of such a decoder is that if a bit is received erroneously two or more times, the decoder will select the erroneous bit as correct. There is tradeoff between decoder architecture complexity and bit error rate. A desire for a lower bit error rate typically results in higher complexity decoder architecture than would be the case if a higher bit error rate was permitted. An architecture, system, or method that results in a less complex decoder while maintaining a low the bit error rate is desirable.

SUMMARY

A method and systems for reducing the complexity of a parity checker are described herein. In at least some preferred embodiments, a parity-check decoder includes column store units and one or more alignment units, which are coupled to the column store units. The column store units outnumber the alignments units.

In other preferred embodiments, a system includes a receiver and a parity-check decoder coupled to the receiver. The parity-check decoder includes column store units and one or more alignment units, which are coupled to the column store units. The column store units outnumber the alignments units.

In yet other preferred embodiments, a method of parity checking includes aligning data to produce wide words using aligning units and storing columns of the data using storing units. The storing units outnumber the aligning units.

BRIEF DESCRIPTION OF THE DRAWINGS

For a more complete understanding of the present disclosure and the advantages thereof, reference is now made to the accompanying drawings and detailed description, wherein like reference numerals represent like parts.

DETAILED DESCRIPTION

Figure 1:
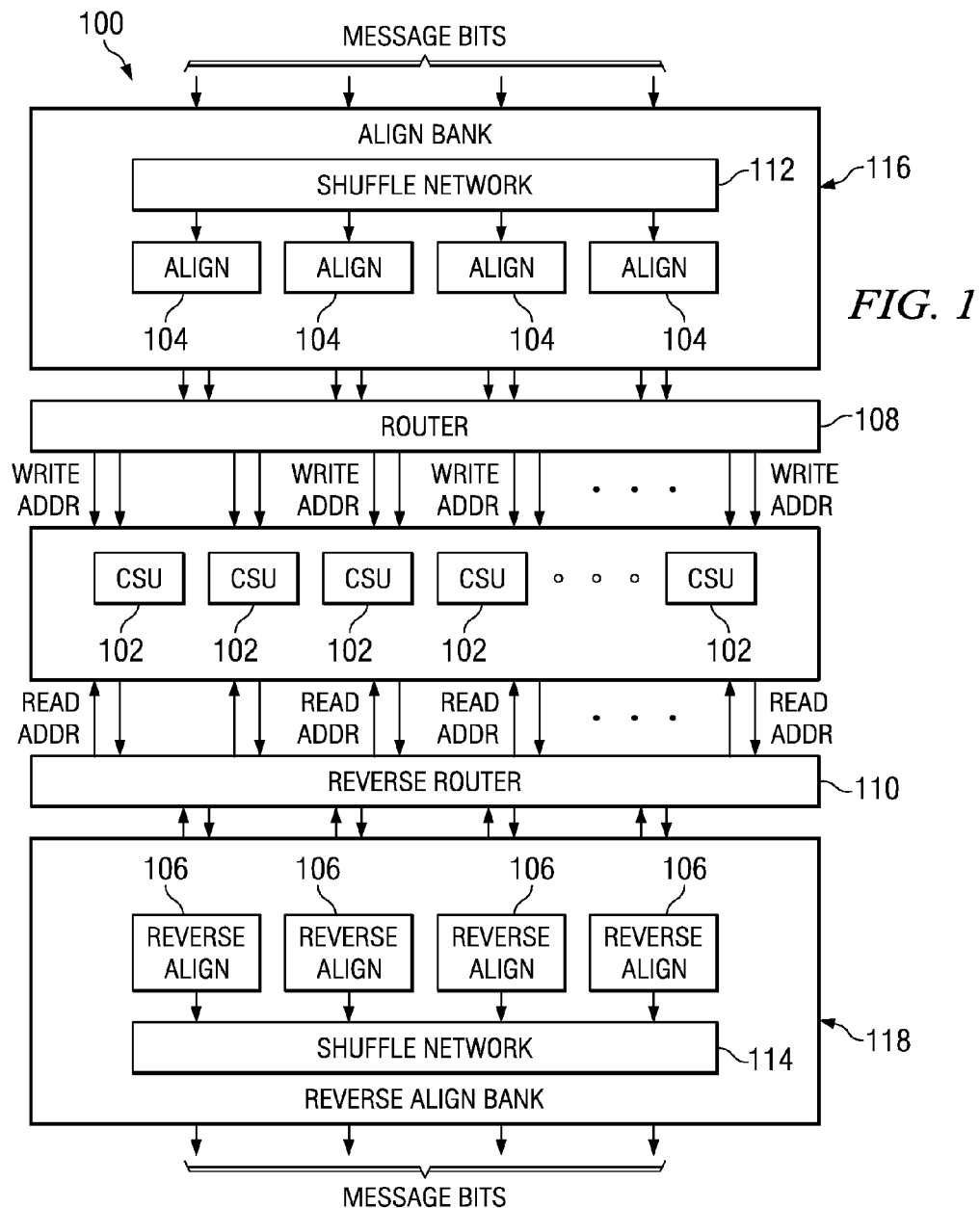
FIG. 1 illustrates a partial decoder architecture constructed in accordance with at least some preferred embodiments.

It should be understood at the outset that although several illustrative embodiments are described below, the present disclosure may be implemented using any number of techniques whether currently known or later developed. The present disclosure should in no way be limited to the illustrative embodiments described and illustrated herein, and may be modified within the scope of the appended claims along with their full scope of equivalents.

Certain terms are used throughout the following claims and discussion to refer to particular system components. This document does not intend to distinguish between components that differ in name but not function. In the following discussion and in the claims, the terms "including" and "comprising" are used in an open-ended fashion, and thus should be interpreted to mean "including but not limited to". Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware components, and may be used to refer to an electronic device or circuit, or a portion of an electronic device or circuit.

A low-density parity-check ("LDPC") code is a type of redundant code that enables accurate detection and correction of the bits of signals sent over a communication channel. The "parity-check" adjectives refer to verifying the transmission using a matrix H, which defines the code, in conjunction with the parity bits to detect and correct errors. The "low-density" adjectives refer to the sparsity of H. Any sparse matrix, including H, has zero for the value of the majority of its elements.

The matrix H is designed such that a zero matrix results when H is multiplied by t, as described by the equation $$Ht=0, \qquad (1)$$

wherein t is a non-erroneous, or valid, set of bits. Hence, whenever $Ht \neq 0$, it is known that t contains erroneous bits. Each set t consists of the source message, s, combined with the corresponding parity-check bits for that particular s. When a set t is transmitted, the receiving network element receives a vector r, which is equal to t plus n, as described by the equation $$r=t+n, \qquad (2)$$

wherein n is the noise added by the channel. Because an LDPC decoder at the receiver designed to recognize the coding scheme, and hence matrix H, it can compute a vector z=Hr. Because r=t+n, and because Ht=0, the vector z is computed using the equation $$z=Hr=Ht+Hn=Hn. \qquad (3)$$

The decoding process thus involves finding the sparsest vector x that satisfies the equation:

$$Hx=z. \qquad (4)$$

The vector x becomes the best guess or predictor for noise vector n, which can be subtracted from the received signal vector r to recover set t, thus detecting and correcting errors in the transmitted signal t.

The decoding process involves the iterative manipulation of the signal vector expressed as fractional values in several bits. In at least some preferred embodiments, parity check matrix H is arranged into a composite of circularly shifted identity matrices. This composite is represented by a macro matrix $H_m$, with a 1 value symbolizing a q×q circularly shifted identity matrix and a 0 value symbolize a q×q zero matrix.

FIG. 1 illustrates data flow in part of an LDPC decoder, which implements the computations above. Specifically, FIG. 1 illustrates an interconnection system 100 that passes data messages in a decoder. Messages are passed in the form of wide words, i.e., a string of more than 8 bits. As such, and due to the decoding process described above, the data messages must be manipulated into correct form, i.e., from storage order to processing order, as represented by the circularly shifted identity matrices. Such manipulation is performed by an alignment bank 116 and a reverse alignment bank 118. Alignment units 104 and reverse alignment units 106 manipulate the data messages and output P values at a time, wherein P is the number of parity check rows being processed in parallel. In at least some preferred embodiments, P comprises the maximum row weight of $H_m$. In other embodiments, P is less than the maximum row weight of $H_m$. Alignment units 104 and reverse alignment units 106 are not maintained in a one-to-one ratio with column store units ("CSUs") 102. The alignment units 104 and reverse alignment units 106 are disassociated from the CSUs 102 are independently placed within the alignment bank 116 and reverse alignment bank 118 respectively as depicted in FIG. 1. In at least some preferred embodiments, the number of alignment units 104 is equal to the number of reverse alignment units 106. The alignment units 104 are coupled to a shuffle network 112, also in the alignment bank 116. The alignment bank 116 is coupled to a router 108, which includes address generation logic (not shown) to ensure delivery to the CSUs 102. The CSUs 102 are coupled to a reverse router 110, which performs the reciprocal function of the router 108. The reverse alignment bank 118 comprises the reverse alignment units 106 coupled to another shuffle network 114.

In at least some preferred embodiments, the number of alignment units 104 is equal to the maximum row weight in macro matrix $H_m$, which is equal to the maximum row weight of parity-check matrix H, used by the decoder. The maximum row weight of $H_m$ (as well as H) is the number of non-zero elements appearing in the row with the maximum number of non-zero elements. Because the number of CSUs 102 is equal to the number of columns in $H_m$, the maximum row weight is preferably less than the number of CSUs 102. In various embodiments, the number of CSUs is less than the number of columns in $H_m$.

In other preferred embodiments, the number of alignment units 104 is not equal to the number of reverse alignment units 106, but both numbers are less than the number of column store units 102. In yet other preferred embodiments, the number of alignment units 104 and the number of reverse alignment units 106 are greater than the maximum row weight, but less than the number of column store units 102.

For well-defined, low-density parity-check codes, there is a large discrepancy between the maximum row weight of $H_m$ and number of columns in $H_m$. Exploiting this characteristic by implementing the described embodiments allows for reduction of logic complexity due to a reduction in both the number of alignment units 104 and reverse alignment units 106. A reduction of this type is significant because for macro matrices with a large number of columns, and hence a large number of CSUs 102, the duplication of alignment units 104 and reverse alignment units 106 in order to maintain a one-to-one ratio with the CSUs 102 constitutes a large source of redundancy in the decoder. Depending upon how many units are excised, the described embodiments can eliminate hundreds of thousands to millions of logic gates as compared to designs that maintain a one-to-one ratio. For instance, applying the described architecture to the WiMax (802.16e) context, the number of alignment/reverse alignment pairs can be reduced, saving about 120,000 logic gates. The broad nature of this efficiency boosting implementation allows the architecture to be applied to a decoder used for a variety of code rates and sizes. A code rate is a ratio of non-redundant bits and total bits per message, e.g., ⅓. A code size is the number of columns in the matrix H and can vary over a large range depending on the complexity of the encoding and number of bits in the message.

Figure 2:
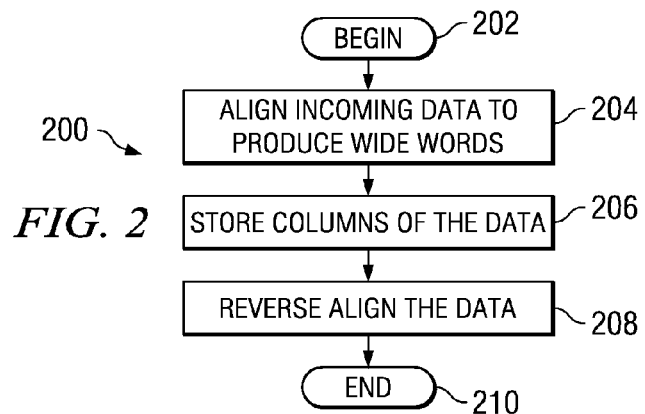
FIG. 2 illustrates a method for decoding a low-density parity-check code in accordance with at least some preferred embodiments.

FIG. 2 is a flow chart illustrating a method 200 of message passing used in an LDPC decoder. Referring to both FIGS. 1 and 2, after beginning at block 202, incoming data are aligned by the alignment bank 116 to produce wide words in block 204. Here, the alignment units 104 generate the memory write addresses and write enable signals for the CSUs 102. Next, the data are routed to the correct column store units 102 by the router 108.

At block 206, each column store unit 102 keeps a current estimate of bits of the wide word by storing the intrinsic information of these bits with the extrinsic information of these bits passed to it by the router 108. The number of column store units 102 is greater than the number of alignment units 104. At block 208, reverse alignment is performed by the reverse alignment bank 118. The reverse router 110 passes data to the reverse alignment units 106, which generate the memory read addresses. Next, a shuffle network 114 manipulates the data to the format required by the data path, signaling the end of the method 210.

In at least some preferred embodiments, the column store units 102 outnumber the reverse alignment units 106. Also, the number of alignment units 104 equals the number of reverse alignment units 106, and the number of alignment units equals a maximum row weight of the parity-check matrix used by the decoder. In other preferred embodiments, the number of alignment units 104 is not equal to the number of reverse alignment units 106, but both are less than the number of column store units 102.

While several embodiments have been provided in the present disclosure, it should be understood that the disclosed systems and methods may be embodied in many other specific forms without departing from the present disclosure. The present examples are to be considered as illustrative and not restrictive, and the intention is not to be limited to the details given herein. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations will become apparent to those skilled in the art. It is intended that the following claims be interpreted to embrace all such changes, substitutions, and alterations.

What is claimed is:

1. A low density parity check parity-check (LDPC) decoder comprising:
   a plurality of column store units; and
   one or more alignment units coupled to the plurality of column store units;
   wherein the plurality of column store units outnumber the one or more alignment units.

2. The low density parity check parity-check (LDPC) decoder of claim 1, wherein an amount of the one or more alignment units is equal to a maximum row weight in a parity-check matrix used by the parity-check decoder.

3. The low density parity check parity-check (LDPC) decoder of claim 1, wherein the one or more alignment units generate memory-write addresses and write-enable signals to control the plurality of column store units.

4. The low density parity check parity-check (LDPC) decoder of claim 1, wherein the low density parity-check (LDPC) decoder implements one or more code rates and one or more code sizes to decode one or more signals transmitted over one or more communication channels.

5. The low density parity check parity-check (LDPC) decoder of claim 1, further comprising:
   a router coupled to the column store units;
   wherein the one or more alignment units are coupled to the plurality of column store units via the router.

6. The low density parity-check (LDPC) decoder of claim 5, further comprising a first shuffle network coupled to the router via the one or more alignment units.

7. The low density parity-check (LDPC) decoder of claim 1, further comprising:
   one or more reverse alignment units coupled to the plurality of column store units;
   wherein the plurality of column store units outnumber the one or more reverse alignment units.

8. The low density parity-check (LDPC) decoder of claim 7, wherein the one or more reverse alignment units generate memory-read addresses to control the plurality of column store units.

9. The low density parity-check (LDPC) decoder of claim 7, wherein a first number of the one or more alignment units is equal to a second number of the one or more reverse alignment units.

10. The low density parity-check (LDPC) decoder of claim 7, further comprising:
    a reverse router coupled to the plurality of column store units;
    wherein the one or more reverse alignment units are coupled to the plurality of column store units via the reverse router.

11. The low density parity-check (LDPC) decoder of claim 10, wherein a second shuffle network is coupled to the reverse router via the one or more reverse alignment units.

12. A system comprising:
    a receiver; and
    a low density parity-check (LDPC) decoder coupled to the receiver,
    wherein the parity-check decoder comprises one or more alignment units coupled to a plurality of column store units; and
    wherein the plurality of column store units outnumber the one or more alignments units.

13. The system of claim 12, wherein an amount of the one or more alignment units is equal to a maximum row weight in a parity-check matrix used by the low density parity-check (LDPC) decoder.

14. The system of claim 12, wherein the low density parity-check (LDPC) decoder and receiver are embedded in a communication electronic device.

15. The system of claim 12, wherein the low density parity-check (LDPC) decoder further comprises one or more reverse alignment units coupled to the plurality of column store units, wherein the plurality of column store units outnumber the one or more reverse alignment units.

16. The system of claim 15, wherein the low density parity-check (LDPC) decoder further comprises:
    a router coupled to the plurality of column store units; and
    a reverse router coupled to the plurality of column store units;
    wherein the one or more alignment units are coupled to the plurality of column store units via the router; and
    wherein the one or more reverse alignment units are coupled to the plurality of column store units via the reverse router.

17. The system of claim 15, wherein a first number of the one or more alignment units is equal to a second number of the one or more reverse alignment units.

18. A method of low density parity checking (LDPC) comprising:
    aligning data to produce wide words using aligning units of a hardware low density parity-check decoder; and
    storing columns of the data using storing units of a hardware parity-check decoder, the storing units outnumbering the aligning units.

19. The method of claim 18, wherein aligning the data comprises aligning the data to produce words having a bit-length equal to the number of rows of a low density parity check matrix H being processed in parallel by the low density parity check decoder.

20. The method of claim 18, further comprising reverse-aligning the data using reverse aligning units, the storing units outnumbering the reverse aligning units.

21. The method of claim 20, wherein reverse-aligning the data comprises reverse-aligning the data using reverse aligning units, the storing units outnumbering the reverse aligning units, and the reverse aligning units equally numbering the aligning units.

* * * * *